United States Patent

Nettleship

[15] 3,683,112

[45] Aug. 8, 1972

[54] TEMPERATURE COMPENSATED AMPLIFIER EMPLOYING COMPLEMENTARY PAIRS OF TRANSISTORS

[72] Inventor: Robert Nettleship, Cambridge, England

[73] Assignee: Pye Limited, Cambridge, England

[22] Filed: April 16, 1970

[21] Appl. No.: 29,021

[30] Foreign Application Priority Data

April 24, 1969 Great Britain..........21,038/69

[52] U.S. Cl.....................................179/1 A, 330/23

[51] Int. Cl................................................H03f 1/30

[58] Field of Search...179/1 A; 330/18, 23; 307/297, 307/313

[56] References Cited

UNITED STATES PATENTS 3,551,832 12/1970 Graeme.......................330/23

OTHER PUBLICATIONS

Harry W. Parmer, Electronics, " Two Easy Ways to Stabilize Power-Trans. Hi-Fi Amps." , Oct. 26, 1962, p. 56–58.

*Primary Examiner*—Kathleen H. Claffy
*Assistant Examiner*—Douglas W. Olms
*Attorney*—Frank R. Trifari

[57] ABSTRACT

An amplifier including a first transistor and second and third transistors forming a complementary pair. The first and second transistors are of the same type. An input signal is applied to the emitter of the first transistor and a constant current to its collector, which is also connected to the base of the second transistor. The bases of the first and third transistors are connected while the emitters of the second and third transistors are commoned and connected to a load. A power supply is connected to the collectors of the second and third transistors.

8 Claims, 3 Drawing Figures

PATENTED AUG 8 1972
3,683,112
FIG. 1.
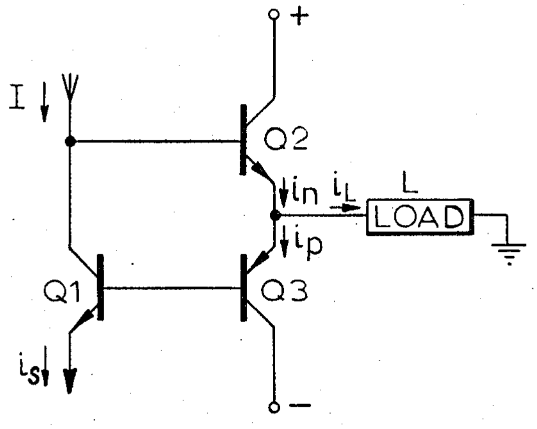
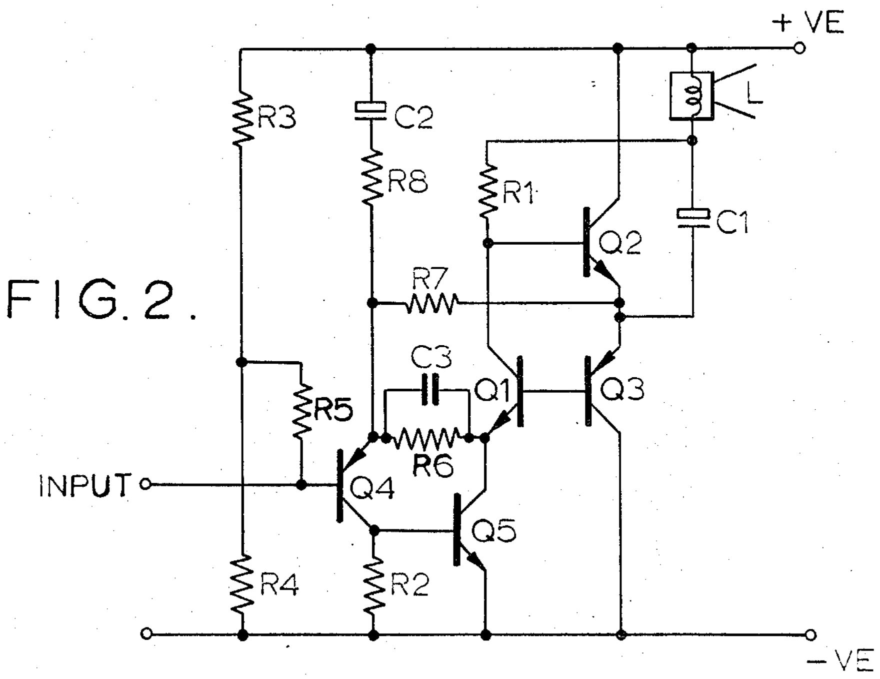
FIG. 3.
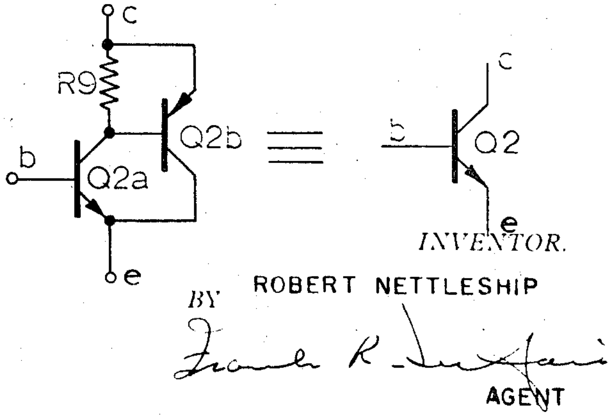
INVENTOR.
BY ROBERT NETTLESHIP
AGENT

TEMPERATURE COMPENSATED AMPLIFIER EMPLOYING COMPLEMENTARY PAIRS OF TRANSISTORS

The present invention relates to circuit arrangements employing a complementary pair of transistors. The term complementary pair is used here to indicate a pair of transistors of opposite conductivity types but which have complementary characteristics. The invention is particularly relevant to such circuit arrangements which operate as Class AB amplifiers.

In known arrangements of such amplifiers where the complementary pair are power output transistors, it is necessary to provide means, usually present, for critically adjusting the bias of the output transistors in accordance with the characteristics of the particular transistors employed.

It is also necessary to arrange that the bias voltage shall change with a change of junction temperature, following a law related to the $V_{be}$/temperature characteristic of the transistors, to prevent the onset of thermal runaway in these transistors.

Feedback resistors may be provided in the emitter circuits of the output transistors to modify the $V_{be}$/temperature characteristic. The bias adjustment then becomes especially critical if excessive crossover distortion is to be avoided.

It is an object of the present invention to provide a circuit arrangement of the type to which the invention relates in which the quiescent current flowing in the complementary pair of transistors is substantially independent of ambient temperature so that there is virtually no possibility of thermal runaway.

The present invention provides a circuit arrangement employing first, second and third transistors, said second and third transistors forming a complementary pair while said first and second transistors are of a like conductivity type. The circuit also includes means for applying an input signal to the emitter of said first transistor and means for applying a substantially constant current to the collector of said first transistor, said collector of the first transistor is connected to the base of said second transistor while the base of said first transistor is connected to the base of said third transistor, the emitters of said second and third transistors being commoned and adapted for connection to a load while their collectors are adapted for connection to the positive and negative terminals of a power supply.

In such an arrangement the first transistor acts as a biassing transistor, a signal being derived from the base of this transistor for the base of the third transistor.

One terminal of the load may be connected to the terminal of the power supply to which the collector of the second transistor is also connected, the substantially constant current being derived through a resistor connected to the junction of the other terminal of the load and a capacitor coupling the load to the commoned emitters. The second or third transistors may be formed by a plurality of opposite conductivity type transistors providing the characteristics required of the second or third transistors.

The invention is particularly applicable to audio amplifiers when the second and third transistors, form the output transistors the load for the amplifier being a loudspeaker or combination of loudspeakers.

With a circuit arrangement according to the present invention, for small signals, the second and third (output) transistors operate in Class A, thereby minimizing crossover distortion. The necessity for critical adjustment of the output transistor bias is also avoided, as is the necessity of providing emitter feedback resistors.

The above and other features of the present invention will be more readily understood by a perusal of the following description having reference to the accompanying drawing, in which:

FIG. 1 is a simplified circuit diagram of a circuit arrangement according to the present invention;

FIG. 2 is a more detailed circuit diagram of the circuit of FIG. 1, and

FIG. 3 is a diagram of a modification applicable to the circuit of FIG. 2.

Referring first to FIG. 1, Q1 is a low-power NPN transistor while Q2 and Q3 form a complementary pair of output transistors connected in series Q2 being of the npn and Q3 of the pnp type. The collector of transistor Q1 and the base of transistor Q2 are connected together and are additionally connected to a source (not shown) of substantially constant current I. The base of transistor Q1 is connected to the base of transistor Q3 while the emitter of transistor Q2 is connected to the emitter of transistor Q3 and to one terminal of a load impedance L. The collector of transistor Q2 is connected to a positive terminal power supply while the collector of transistor Q3 is connected to negative terminal of the supply. The remaining terminal of the load L returned to earth which may be electrically mid-way between the positive and negative terminals or, if solution is provided, may form either the positive or negative terminal. An input driving current $r_s$ is fed to the emitter of transistor Q1.

The operation of the circuit may be explained as follows:

Let the common emitter current amplification factors of transistors Q1, Q2 and Q3 be respectively B, N and P. Let the emitter current of transistor Q2 be $i_n$, the emitter current of transistor Q3 be $i_p$, and the load current be $i_l$.

Under quiescent conditions $i_1=0$ and therefore $$i_n=i_p=i_o \text{ (say)}$$

The base current of Q1 must equal the base current of transistor Q3

$$i_s/\mathrm{B}+1=i_n/\mathrm{P}+1=i_o/\mathrm{P}+1$$

But by definition $i_s$ = collector current of Q1 times B + 1/B $$\therefore i_s=\left(I-\frac{i_n}{N+1}\right)\cdot\frac{B+1}{B}$$

$$\therefore \frac{1}{B+1}\cdot\left(I-\frac{i_o}{N+1}\right)\cdot\frac{B+1}{B}=\frac{i_o}{P+1}$$

whence $$i_o=I\cdot\frac{N+1}{1+B\dfrac{(N+1)}{(P+1)}}$$

But N, P and B are all much greater than unity. Therefore the denominator reduces to B. (N + 1)/ $P$ + 1) and $i_o$ = I $(p+1)/(B)$, i.e. $i_o$ is independant of N.

P and B change in a similar manner with changes of ambient temperature, and also P and B are of the same order of magnitude. Typically P and B have temperature coefficients of the order of 1 percent/° C, and 2>P/BΦ0.5. Therefore $i_o$ is independent of temperature and is determined by the value of I.

There are three non-quiescent conditions to consider:

i. Small signals, i.e. $i_L$ $i_o$

Both transistors Q2 and Q3 conduct, giving Class A operation and hence low crossover distortion.

ii. Load current $i_1$ large in the negative direction. Transistor Q1 bottoms, cutting off transistor Q2, transistor Q3 being active, giving a current gain of (P+1).

iii. Load current $i_1$ large in the positive direction. Transistor Q2 is active, giving a current gain of (N + 1) while transistor Q3 takes an almost constant current substantially equal to $i_o$.

FIG. 2 illustrates a typical audio amplifier embodying the invention. The load comprises a loudspeaker L having one terminal of its speech coil connected to the positive supply terminal while its other terminal is connected through a coupling capacitor C1 to the emitters of transistors Q2 and Q3.

The constant current I is provided in FIG. 2 by a resistor R1 connected in a bootstrap circuit between the junction of capacitor C1 and the speech coil and the junction of the collector of transistor Q1 with the base of transistor Q2. Irrespective of variations in amplifier output voltage, the voltage appearing across resistor R1 will be constant. The current through resistor R1 therefore depends only on the supply voltage and on the resistive value of R1.

The input driving current $i_s$ to the emitter of transistor Q1 is provided by a transistor Q5 having its collector connected to the emitter of transistor Q1 and its emitter connected to the negative supply terminal. The base of transistor Q5 is connected to the collector of an input transistor Q4, a load resistor R2 for the latter transistor being connected between its collector and the negative supply terminal.

The input signal is applied to the amplifier through the base of transistor Q4 which is suitably biassed through resistor R5 and by a potential divider comprising resistors R3 and R4 connected between the positive and negative supply terminals.

The emitter electrode of transistor Q4 is connected through a resistor R6 to the junction of the emitter of transistor Q1 and the collector of transistor Q5. This connection provides negative feedback, both at d.c. and at signal frequencies. As a result of the feedback, the drive signal at the emitter of transistor Q1 is substantially a voltage drive. The base-emitter junctions of both transistors Q1 and Q3 are forward biassed for both positive and negative excursions of the load, negative feedback from the load through these junctions producing an effect equivalent to that of an emitter-follower. Thus, with voltage drive at the input of the "emitter-follower," a high degree of linearity is obtained.

A resistor R7 connected between the emitter of transistor Q4 and the junction between the emitters of transistors Q2 and Q3 provides overall negative feedback resistor R8 and a capacitor C2 serially connected between the emitter of transistor Q4 and the negative supply terminal set the overall gain and control the low frequency cut-off.

It has so far been assumed that output transistors Q2 and Q3 are of opposite conductivity types and form a complementary pair. The known device illustrated in FIG. 3 permits the output power transistors (Q2 and Q3) to be of the same conductivity type. The NPN output transistor Q2 of FIG. 2 is replaced in FIG. 3 by a low power NPN transistor Q2*a* and an output transistor Q2*b*, which is of the same conductivity type as transistor Q3, connected as shown. By a suitable choice of transistor Q2*a* and of the resistive value of a resistor R9, the combination can be made to behave as the complement of transistor Q3, thus permitting the use of the two PNP power transistors.

Obviously, by employing complementary types for all transistors and reversing the polarity of the same power supply, an amplifier employing two NPN power transistors may be achieved. For the purpose of the present invention, the arrangement of FIG. 3 and its complementary arrangement are considered to provide a transistor which is of opposite conductivity type to the output power transistor with which it is associated. Although in FIG. 3 two transistors are shown as providing a single transistor, more than two transistors may be employed.

The invention has been described with reference to an audio frequency output amplifier. Another application to which the invention is especially adapted is in series/shunt voltage or current regulators, in which it enables good regulation to be obtained through the zero load current region and with reverse load currents.

In a practical arrangement of the circuit of FIG. 2 the following components were employed.

R1 . . . 2K ohm
R2 . . . 2K ohm
R3 . . . 4K ohm
R4 . . . 4K ohm
R5 . . . 4K ohm
R6 . . . 8K ohm
R7 . . . 4K ohm
R8 . . . 100 ohm
C1 . . . 22 $\mu$ Farad
C2 . . . 16 $\mu$ Farad
C3 . . . 2.2 $\mu$ Farad
Q1 . . . 2N 2218
Q2 . . . MJE 521
Q3 . . . MJE 371
Q4 . . . BCY 70
Q5 . . . 2N 2218
L . . . 80 ohm loudspeaker With the above components the supply voltage was 40 volts. The capacitor C3 mentioned in the above list of components is included in the circuit to avoid the risk of high frequency parasitic oscillation in cases where long connecting loads are provided to connect the loudspeaker load into the circuit.

What is claimed is:

1. A transistor circuit comprising first and second transistors of the same conductivity type and a third transistor of opposite conductivity type, each of said transistors having first and second main electrodes and a base electrode, a power supply, means connecting said second and third transistors with each of their main electrodes in series across the terminals of the power supply to form a complementary pair with a common junction, means connecting a first main electrode of the first transistor to the base of said second transistor and the base of said first transistor directly to the base of said third transistor, means connecting said common junction to a load, means for applying a constant current to said first main electrode of the first transistor, and means for applying an input signal only to the second main electrode of said first transistor whereby said signal is only transmitted to said second or third transistors through said first transistor.

2. A circuit as claimed in claim 1 wherein said signal applying means comprises a fourth transistor having first and second main electrodes connected in series with the main electrodes of said first transistor and of the same conductivity type as said first transistor.

3. A circuit as claimed in claim 1 further comprising a capacitor, said load connecting means including means connecting one terminal of the load to one terminal of the power supply and the other load terminal to said common junction via said capacitor, and wherein said constant current applying means includes a resistor connected to said other load terminal and to said first main electrode of the first transistor.

4. A circuit as claimed in claim 1 wherein said first and second transistors are of the NPN type and said third transistor is of the PNP type, said first transistor first main electrode comprising the collector electrode, and the emitter electrodes of said second and third transistors being connected together to form said common junction.

5. A circuit as claimed in claim 1 wherein said signal applying means comprises a fourth transistor having first and second main electrodes connected in series with the main electrodes of said first transistor, a fifth transistor having a first main electrode connected to the base of the fourth transistor and a base electrode coupled to the signal source, first negative feedback means including a first resistor connected between a second main electrode of the fifth transistor and a common junction between said first and fourth transistors, and second negative feedback means comprising a second resistor connected between the second main electrode of the fifth transistor and the common junction between the second and third transistors.

6. A circuit as claimed in claim 1 wherein the second main electrode of the first transistor comprises the emitter electrode and the first main electrode thereof comprises the collector electrode, and further comprising means connecting the emitters of said second and third transistors together in common to form said common junction and their collectors to the positive and negative terminals of said power supply.

7. A circuit as claimed in claim 6 further comprising means connecting one terminal of said load to that terminal of said power supply to which the collector of said second transistor is also connected, and wherein said means connecting the common junction to the load comprises a capacitor coupling the other terminal of the load to the common junction of the emitters of said second and third transistors, and wherein said constant current means comprises a resistor connected to the collector of the first transistor and to a junction between the capacitor and said other terminal of the load.

8. A circuit as claimed in claim 1 in which the second and third transistors form the output transistors of an audio amplifier and the load comprises a loudspeaker or combination of loudspeakers.

* * * * *